United States Patent
Li et al.

(10) Patent No.: US 6,291,327 B1
(45) Date of Patent: Sep. 18, 2001

(54) OPTIMIZATION OF S/D ANNEALING TO MINIMIZE S/D SHORTS IN MEMORY ARRAY

(75) Inventors: Xiao-Yu Li; Sunil D. Mehta, both of San Jose; Christopher O. Schmidt; Robert H. Tu, both of Sunnyvale, all of CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/192,094

(22) Filed: Nov. 13, 1998

(51) Int. Cl.[7] .................. H01L 21/336; H01L 21/76; H01L 21/425
(52) U.S. Cl. .................. 438/530; 438/424; 438/308
(58) Field of Search .................. 438/424, 530, 438/308, 197, 514, 522, 301

(56) References Cited

U.S. PATENT DOCUMENTS

| | | | | |
|---|---|---|---|---|
| 5,538,906 | * | 7/1996 | Aoki | 437/29 |
| 5,899,714 | * | 5/1999 | Farrenkopf et al. | 438/202 |
| 5,981,347 | * | 11/1999 | Kuo et al. | 438/308 |
| 5,998,284 | * | 12/1999 | Azuma | 438/514 |
| 6,040,019 | * | 3/2000 | Ishida et al. | 427/526 |

* cited by examiner

Primary Examiner—Amir Zarabian
Assistant Examiner—Adam Pyonin
(74) Attorney, Agent, or Firm—Davis Chin

(57) ABSTRACT

A method for eliminating source/drain shorting generated during the highly-doped source/drain implant steps in a standard STI process is provided. This is achieved by reducing the RTA temperature to be less than 1000° C. so as to minimize enhanced doping diffusion. Further, the energy level for the highly-doped source/drain implant steps is increased so to compensate for poly depletion in the gate electrodes.

5 Claims, 2 Drawing Sheets

OPTIMIZATION OF S/D ANNEALING TO MINIMIZE S/D SHORTS IN MEMORY ARRAY

BACKGROUND OF THE INVENTION

1. Field of the Invention

This invention relates generally to methods for fabricating semiconductor integrated circuits such as memory devices and more particularly, it relates to a method of minimizing the problem of source/drain shorts in sub-micron shallow trench isolation (STI) technology employed in semiconductor integrated circuit fabrication of memory devices.

2. Description of the Prior Art

As is generally known, in the manufacturing of semiconductor integrated circuits there is typically required isolation of devices (active regions) from one another which are formed on a semiconductor substrate. One such isolation technique is known as LOCOS (local oxidation of silicon) where an isolation region is grown on the substrate between the active regions by thermal oxidation. However, in view of the advances made in semiconductor integrated circuit technology and reduction of device sizes so as to achieve higher density, it has been found that a newer isolation method referred to as "shallow trench isolation" (STI) has become the replacement for the conventional LOCOS technology for sub-micron process technology. In the basic STI technology, there is involved the etching of the semiconductor substrate in order to form trenches and thereafter the re-filling of the trenches with an insulating material so as to produce an isolation region.

While it is desirable to use silicon dioxide layers as trench fill dielectric layers within advanced integrated circuit fabrication, it is generally known that such trench-refilling oxide may shrink during subsequent fabrication steps (e.g., thermal annealing) which will cause mechanical stress in the active silicon substrate. This mechanical stress is believed to cause the generation of dislocations or defect sites in the active substrate. This problem is discussed in a paper entitled "Mechanical Stress Induced MOSFET Punch-Through and Process Optimization for Deep Submicron TEOS-$O_3$ Filled STI Device," by K. Ishimaru et al., 1997 Symposium on VLSI Technology Digest of Technical Papers, pp. 123–124.

Further, this generation of dislocations or defect sites in the active substrate was found to enhance doping diffusion, which will cause other undesirable effects. For example, in one case investigated a higher leakage current was found to exist between the source and drain regions of a transistor device formed during subsequent process steps in the substrate, thereby resulting in a lower product yield of the manufacturing operation. It is believed that the failure mechanism is due to the impurities implanted to form the highly-doped source/drain regions diffusing into the channel region and thus causing the channel width of the transistor to decrease. Consequentially, the leakage current will be increased and thus can cause "shorting" of the source and drain regions.

In co-pending application Ser. No. 09/192,096 filed on Nov. 13, 1999 and entitled "Reduction of Mechanical Stress in Shallow Trench Isolation Technology", there are disclosed various process fixes for eliminating mechanical stress by either, (a) forming a trench with a more sloped and smooth profile, (b) limiting the trench depth to be less than 0.4 $\mu$m, (c) reducing or increasing the trench densification temperature, and/or (d) performing the densification step after chemical-mechanical polishing. This application Ser. No. 09/192,096 is assigned to the same assignee as the present invention and is hereby incorporated by reference. As an alternative to these aforementioned process fixes, the inventors of the present invention have developed another way to minimize the problem of source/drain shorts by performing simply modifications to the STI process.

Accordingly, it would be still desirable to provide a method of minimizing the problem of source/drain shorts in current standard STI process on a more effective and efficient basis. This is achieved in the present invention by reducing the rapid thermal annealing (RTA) temperature so as to minimize the enhanced diffusion from the source and drain regions to the channel region underneath the gate area. Further, in order to compensate for the problem of poly depletion in the gate area caused by the lower RTA temperature, the energy level used to implant the source/drain regions is made higher.

SUMMARY OF THE INVENTION

Accordingly, it is a general object of the present invention to provide a method of minimizing the problem of source/drain shorts in a standard STI process which overcomes the problems of the prior art.

It is an object of the present invention to provide a method of minimizing source/drain shorts in a standard STI process which can be implemented with only minor modifications to the same.

It is another object of the present invention to provide a method of minimizing source/drain shorts in a standard STI process which includes reducing the RTA temperature so to lower enhanced diffusion from the source/drain regions.

It is still another object of the present invention to provide a method of minimizing source/drain shorts in a standard STI process which further includes raising the energy level used for implanting the source/drains so as to compensate for poly depletion in the gate area.

In accordance with a preferred embodiment of the present invention, there is provided a method of minimizing source/drain shorts in a standard shallow trench isolation (STI) process. A plurality of trenches are formed in a semiconductor substrate so as to create isolation regions to electrically isolate at least a pair of first and second active NMOS areas formed in the substrate from each other. First and second gate electrodes are formed on the top surface of the substrate and overlies respectively the first and second active NMOS areas.

Impurity ions are implanted into the first and second active NMOS areas with the first and second gate electrodes acting as masks so as to form N-type lightly-doped drain regions. Sidewall spacers are formed on each side of the first and second gate electrodes. The impurity ions are implanted into the first and second active NMOS areas with the first and second gate electrodes and the sidewall spacers acting as masks so as to form N-type highly-doped source/drain regions. A rapid thermal annealing process is performed at a temperature of less than 1000° C. so as to activate the highly-doped source/drain regions.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Before describing in detail the method of minimizing the problem of source/drain shorts of the present invention, it is believed that it would be helpful in understanding the principles of the instant invention and to serve as a background by explaining initially the fabrication steps for forming MOS transistor devices with source/drain regions in a semiconductor substrate in accordance with a conventional standard shallow trench isolation (STI) fabrication technique with reference to FIGS. 1(a)–1(d). Thus, the conventional STI fabrication process employed for forming MOS transistor devices will now be described hereinbelow as well as the problems associated therewith.

Figure 1A:
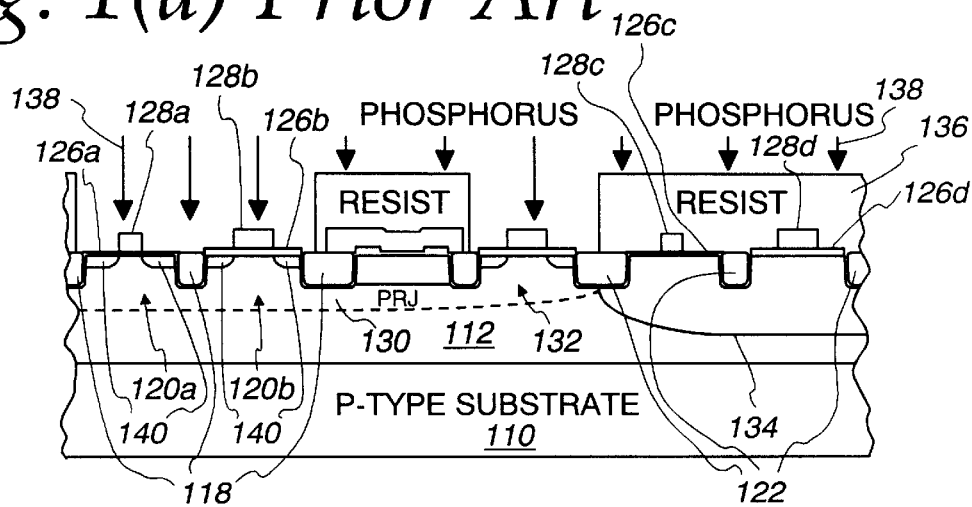
FIGS. 1(a)–1(d) are cross-sectional views of intermediate fabrication steps for forming MOS transistor devices with source/drain regions in a semiconductor substrate, according to a conventional STI fabrication technique.

In FIG. 1(a), there is shown a p-type silicon substrate 110 on top of which is formed an n-type epitaxial (EPI) layer 112. Trenches 118 are etched into the EPI layer so as to electrically isolate active NMOS areas 120a and 120b. Further, trenches 122 are also etched into the EPI layer 112 so as to electrical isolate active PMOS areas 124a and 124b. The trenches 118 and 122 are filled with an insulating dielectric material such as TEOS oxide. On top of the active areas 120a, 120b, 124a, and 124b in the EPI layer, there are formed gate oxide layers 126a–126d respectively on top of which are provided corresponding gate electrodes 128a–128d.

The manufacturing steps used for the program junction region 130 and the associated elements in a memory cell area 132 in FIG. 1(a) do not form a part of the present invention and thus will not be described. Thus, only the manufacturing steps relating specifically to the process for producing subsequently the transistor devices in the active NMOS and PMOS areas 120a, 120b, 124a, and 124b will now be described in detail so as to assist in the understanding the present invention.

Accordingly, after the formation of the elements in the memory cell area 132, an N-well region 134 is implanted with impurity ions such as phosphorous ions into the PMOS areas 124a and 124b. Then, a photoresist layer or mask 136 is applied over the top surface of the gate electrodes 128c and 128d and patterned to leave exposed the area containing the gate electrodes 128a and 128b where an N-type lightly-doped drain (LDD) implant is to be subsequently performed. The N-type LDD implant is achieved by phosphorous ions, as indicated by the arrows 138, at a dose of about $4\times10^{13}$ ions/cm$^2$ and an energy of approximately 25 KeV. As a result, there are formed first lightly-doped drain (LDD) regions 140 in the corresponding active NMOS areas 120a and 120b. This resulting structure is illustrated in FIG. 1(a).

Figure 1B:
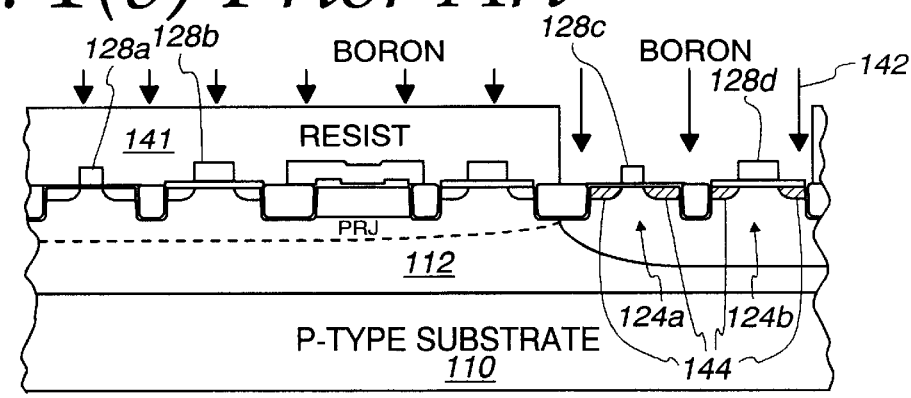

Thereafter, the photoresist layer 136 is removed using conventional processes and another or second photoresist layer or mask 141 is applied over the top surface of the gate electrodes 128a and 128b and is patterned to leave unprotected the area containing the gate electrodes 128c and 128d where a P-type lightly-doped drain (LDD) implant is to be subsequently performed. The P-type LDD implant is achieved by boron ions or BF$_2$, as indicated by the arrows 142, at a dose of about $5.2\times10^{13}$ ions/cm$^2$ and an energy of approximately 35 KeV. As a consequence, there are formed second lightly-doped drain regions 144 in the corresponding PMOS areas 124a and 124b. This resulting structure is illustrated in FIG. 1(b).

Figure 1C:
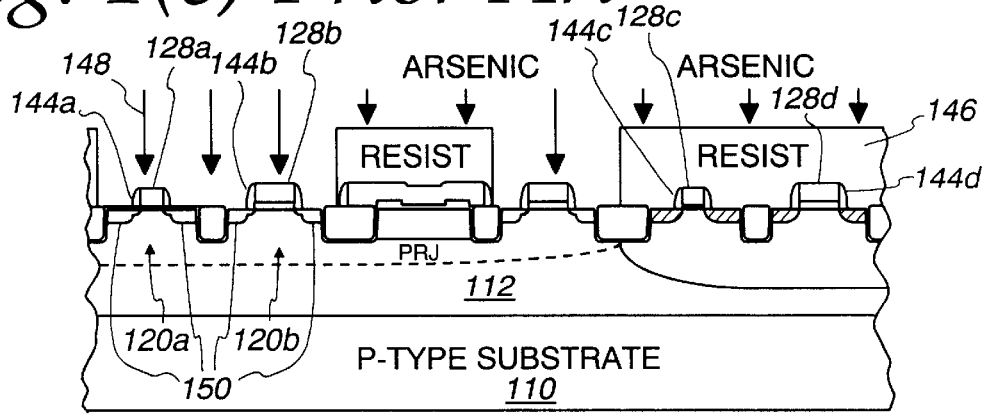

Referring now to FIG. 1(c), after performing a spacer deposition and using an anisotropic etching method, there are etched out corresponding sidewall spacers 144a–144d on each side of the respective gate electrodes 128a–128d. Thereafter, another or third photoresist layer or mask 146 is applied over the top surface of the gate electrodes 128c and 128d and patterned to leave exposed the area containing the gate electrodes 128a and 128b where an N-type highly-doped source/drain implant is to be subsequently performed. The N-type highly-doped source/drain implant is achieved by arsenic or phosphorous ions, as indicated by the arrows 148, at a dose of about $3\times10^{15}$ ions/cm$^2$ and an energy of approximately 80 KeV. Thus, there are formed first highly-doped source/drain regions 150 in the corresponding active NMOS areas 120a and 120b. This resulting structure is illustrated in FIG. 1(c). Next, the photoresist layer 146 is removed and a rapid thermal annealing (RTA) process is performed on the structure so as to activate the source and drain regions 150. This RTA step is conducted in a nitrogen atmosphere at a temperature of about 1050° C. for approximately 30 minutes.

Figure 1D:
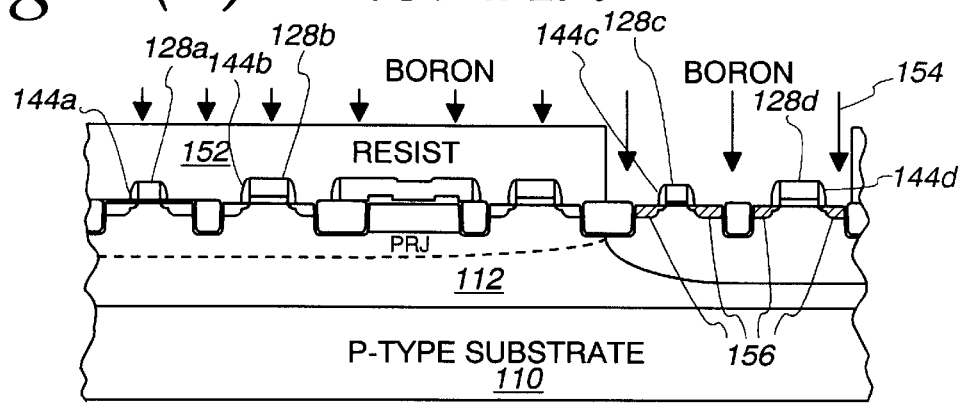

Then, another or fourth photoresist layer or mask 152 is applied over the top surface of the gate electrodes 128a and 128b with sidewall spacers 144a, 144b and patterned to leave unprotected the area containing the gate electrodes 128c and 128d with sidewall spacers 144c,144d where a P-type highly-doped source/drain implant is to be subsequently performed. The P-type highly-doped source/drain implant is achieved by boron ions or BF$_2$, as indicated by the arrows 154, at a dose of about $2\times10^{15}$ ions/cm$^2$ and an energy of approximately 40 KeV. In this manner, there are formed second highly-doped source/drain regions 156 in the corresponding active PMOS areas 120c and 120d. This resulting structure is illustrated in FIG. 1(d). Next, another rapid thermal annealing (RTA) process is performed on the structure so as to activate the source and drain regions 156. This RTA step is also conducted in a nitrogen atmosphere at a temperature of about 1050° C. for approximately 30 minutes.

However, in the above-described conventional STI process, the relatively high temperature (e.g.,1050° C.) of the RTA steps performed both after the N-type highly-doped source/drain implant and the P-type highly-doped source/drain implant will cause the impurities therein to diffuse into the associated channel regions and thus reduce the channel width thereof. Due to this enhanced doping diffusion, the leakage current will be increased and may cause "shorting" of the source and drain regions. This, in turn, will degrade the on-off characteristics of the NMOS and PMOS transistor devices.

In order to eliminate the problem of source/drain shorting, the inventors propose to decrease or reduce the temperature of the RTA steps to be less than 1000° C. so as to minimize enhanced diffusion. However, the lower RTA temperature will cause the problem of poly depletion in the gate electrodes of the transistor devices. To compensate for the poly depletion effect, the inventors have further proposed to increase the energy level for the source/drain implants. It is believed that since the defect sites are adjacent the surface of the substrate the higher energy will maintain the impurities to be farther away from the top surface, thereby avoiding potential shorting of the source and drain regions.

Figure 2:
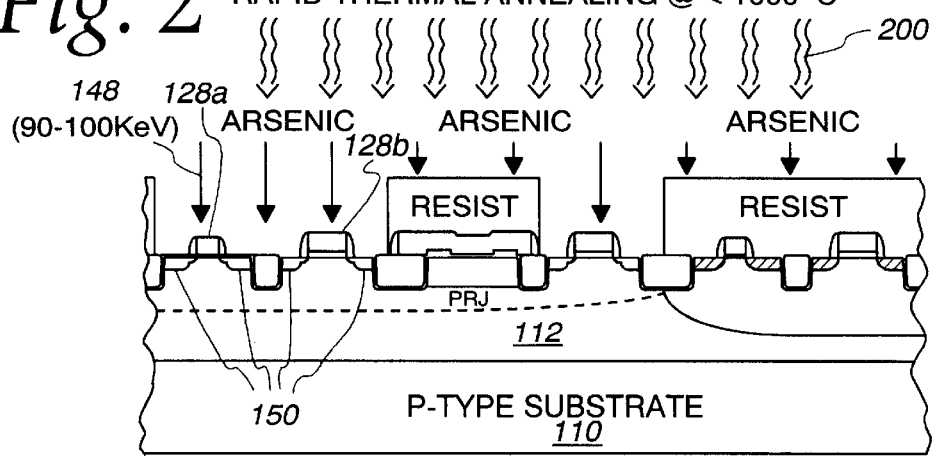
FIG. 2 is a cross-sectional view, similar to FIG. 1(c), of intermediate fabrication steps for forming NMOS transistor devices with source/drain regions in a semiconductor substrate, in accordance with the principles of the present invention.

The method of minimizing source/drain shorts, generated during the source/drain implant steps in a conventional shallow trench isolation (STI) process, in accordance with the principles of the present invention will now be described with reference to FIGS. 2 and 3. As can be seen from FIG. 2, there is illustrated the fabrication steps, similar to FIG. 1(c), for performing the N-type highly-doped source/drain implant of the present method so as to eliminate the source/drain shorting problem in the NMOS areas. The only difference between FIG. 2 and FIG. 1(c) is that the rapid thermal annealing (RTA) process in FIG. 2, as indicated by the arrows 200, is performed preferably at a temperature of less than 1000° C. and more preferably between the range of 800° C. to 1000° C. This lower RTA temperature will minimize the enhanced diffusion and thus reduce the leakage current so as to avoid shorting of the highly-doped source/drain regions 150.

If it is observed that this lower RTA temperature will cause poly depletion in the gate electrodes 128a,128b, then in order to compensate for this effect the energy level at which the N-type highly-doped source/drain implant, prior to the RTA step, is increased by approximately 10–20% over the value used in the conventional STI process. In other words, the energy level for the N-type highly-doped source/drain implant is raised to be between 90 and 100 KeV.

Figure 3:
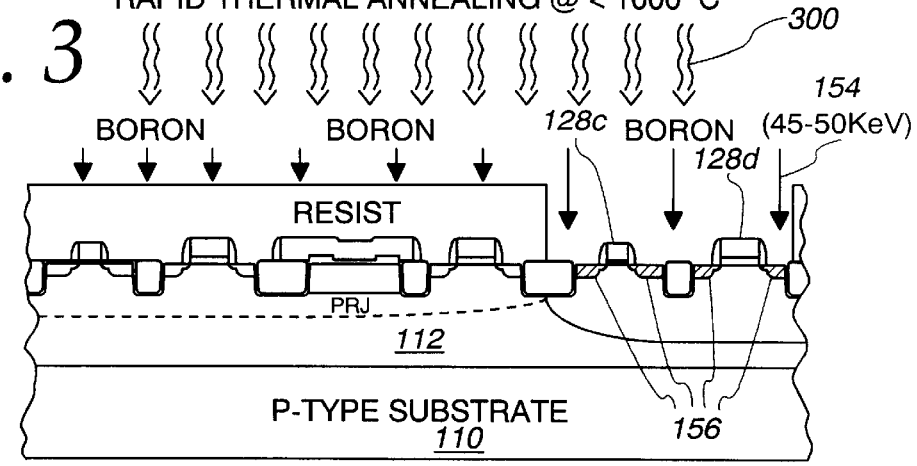
FIG. 3 is a cross-sectional view, similar to FIG. 1(d), of intermediate fabrication steps for forming PMOS transistor devices with source/drain regions in a semiconductor substrate, in accordance with the principles of the present invention.

Similarly, in FIG. 3 there is illustrated the fabrication steps, similar to FIG. 1(d), for performing the P-type highly-doped source/drain implant of the present method so as to eliminate the source/drain shorting problem in the PMOS areas. The only difference between FIG. 3 and FIG. 1(d) is that the rapid thermal annealing (RTA) process in FIG. 3, as indicated by the arrows 300, is performed preferably at a temperature of less than 1000° C. and more preferably between the range of 800° C. to 1000° C. This lower RTA temperature will again minimize the enhanced diffusion and thus reduce the leakage current so as to avoid shorting of the highly-doped source/drain regions 156.

Likewise, if it is observed that this lower RTA temperature will cause poly depletion in the gate electrodes 128c,128d, then in order to compensate for this effect the energy level at which the P-type highly-doped source/drain implant, prior to the RTA step, is increased by approximately 10–20% over the value used in the conventional STI process. In other words, the energy level for the P-type highly-doped source/drain implant is raised to be between 45 and 50 KeV. Since all of the required modifications, shown in FIGS. 2 and 3, to be made to the existing fabrication steps for performing the STI process in connection with forming the NMOS and PMOS transistor devices are achieved with minimal change, the present invention can be implemented very simply and economically without significant increase in the manufacturing cost.

From the foregoing detailed description, it can thus be seen that the present invention provides a method for eliminating source/drain shorting generated during the highly-doped source/drain implant steps in a standard STI process. This is achieved by reducing the RTA temperature to be less than 1000° C. so as to minimize enhanced doping diffusion. Further, the energy level for the highly-doped source/drain implant steps is increased so to compensate for poly depletion in the gate electrodes.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method for minimizing source/drain shorts in a standard shallow trench isolation process, comprising the steps of:

providing a semiconductor substrate;

etching a plurality of trenches in said substrate so as to create isolation regions in order to electrically isolate active regions in said substrate, said active regions including an active NMOS area and an active PMOS area;

forming corresponding first and second gate electrodes on the top surface of said substrate and overlying said respective active NMOS and PMOS areas;

implanting a first type of impurity ions into said active PMOS area so as to form an N-well region;

implanting said first type of impurity ions into said active NMOS area with said corresponding first gate electrode acting as a mask so as to form N-type lightly-doped drain regions;

implanting a second type of impurity ions into said active PMOS area with said corresponding second gate electrode acting as a mask so as to form P-type lightly-doped drain regions;

forming corresponding sidewall spacers on each side of said corresponding first and second gate electrodes;

implanting said first type of impurity ions at an energy level between 90 land 100 KeV into said active NMOS area with said corresponding first gate electrode and sidewall spacers acting as a mask so as to form N-type highly-doped source/drain regions in order to compensate for poly depletion in said first gate electrode;

performing a first RTA process at a temperature between 800 to 1000° C. so as to activate said N-type highly-doped source/drain regions in order to minimize enhanced doping diffusion and to thus reduce leakage current for preventing shorting of said N-type highly-doped source/drain regions;

implanting said second type of impurity ions at an energy level between 45 and 50 KeV into said active PMOS area with said corresponding second gate electrode and sidewall spacers acting as a mask so as to form P-type highly-doped source/drain regions in order to compensate for poly depletion in said second gate electrode; and performing a second RTA process at a temperature between 800 to 1000° C. so as to activate said P-type highly-doped source/drain regions in order to minimize enhanced doping diffusion and to thus reduce leakage current for preventing shorting of said P-type highly-doped source/drain regions.

2. A method for minimizing source/drain shorts as claimed in claim 1, wherein the first type of impurity ions is phosphorus or arsenic.

3. A method for minimizing source/drain shorts as claimed in claim 2, wherein the second type of impurity ions is boron or $BF_2$.

4. A method for minimizing source/drain shorts in a standard shallow trench isolation process, comprising the steps of:

providing a semiconductor substrate;

etching a plurality of trenches in said substrate so as to create isolation regions in order to electrically isolate active regions in said substrate, said active regions including an active NMOS area;

forming gate electrode on the top surface of said substrate and overlying said active NMOS area;

implanting impurity ions into said active NMOS area with said gate electrode acting as a mask so as to form N-type lightly-doped drain regions;

forming sidewall spacers on each side of said gate electrode;

implanting said impurity ions at an energy between 90 and 100 KeV into said active NMOS area with said gate electrode and sidewall spacers acting as a mask so as to form N-type highly-doped source/drain regions in order to compensate for poly depletion in said gate electrode; and performing a RTA process at a temperature of between 800 to 1000° C. so as to activate said N-type highly-doped source/drain regions in order to minimize enhanced doping diffusion and to thus reduce leakage current for preventing shorting of said N-type highly-doped source/drain regions.

5. A method for minimizing source/drain shorts as claimed in claim 4, wherein the impurity ions is phosphorus or arsenic.

* * * * *

UNITED STATES PATENT AND TRADEMARK OFFICE
CERTIFICATE OF CORRECTION

PATENT NO. : 6,291,327 B1
DATED : September 18, 2001
INVENTOR(S) : Li et al.

It is certified that error appears in the above-identified patent and that said Letters Patent is hereby corrected as shown below:

Column 6,
Line 39, "land" should be -- and --

Signed and Sealed this

Twenty-sixth Day of March, 2002

JAMES E. ROGAN
Director of the United States Patent and Trademark Office

*Attest:*

*Attesting Officer*